(12) United States Patent
Morishima

(10) Patent No.: US 7,436,254 B2
(45) Date of Patent: Oct. 14, 2008

(54) CLASS D AMPLIFIER

(75) Inventor: Morito Morishima, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 95 days.

(21) Appl. No.: 11/376,358

(22) Filed: Mar. 15, 2006

(65) Prior Publication Data

US 2006/0208793 A1  Sep. 21, 2006

(30) Foreign Application Priority Data

Mar. 18, 2005  (JP) .............................. 2005-079061

(51) Int. Cl.
*H03F 3/38* (2006.01)
(52) U.S. Cl. ........................................................ 330/10
(58) Field of Classification Search ................. 330/10; 370/212; 375/238
See application file for complete search history.

(56) References Cited

U.S. PATENT DOCUMENTS 6,791,405 B2 * 9/2004 Tsuji et al. ..................... 330/10

FOREIGN PATENT DOCUMENTS

| JP | 59-183510 | 10/1984 |
| JP | H03-36099 | 7/1991 |
| JP | 2000-196374 | 7/2000 |

\* cited by examiner

*Primary Examiner*—Steven J Mottola
(74) *Attorney, Agent, or Firm*—Pillsbury Winthrop Shaw Pittman LLP

(57) ABSTRACT

A D class amplifier of the invention generates a carrier signal Pct based on a master clock Φp without jitter, which is supplied to a PWM circuit. Using a digital PLL including a phase comparator, a loop filter and a carrier oscillator, the generated carrier signal Pct is synchronized with a sampling signal SL. This can produce the carrier signal Pct that is not affected by the jitter contained in the sampling signal SL. Because a phase difference between the sampling signal SL and the carrier signal Pct is fedback to through a feedback circuit, jitter, which can be produced by a slight difference between the sampling signal SL and the master clock Φp can be eliminated.

6 Claims, 15 Drawing Sheets

CLASS D AMPLIFIER

PRIORITY CLAIM

Priority is claimed on Japanese Patent Application No. 2005-079061 filed with the Japanese Patent Office on Mar. 18, 2005, the content of which is incorporated herein by reference.

BACKGROUND OF THE INVENTION

1. Field of the Invention

The invention relates to a class D amplifier that converts PCM (Pulse Code Modulation) sound (musical tone) data into a PWM (Pulse Width Modulation) signal to be amplified and output, and particularly to a class D amplifier that is designed to reduce output noise

2. Description of Related Art

As is well known, in this type of D class amplifier, jitter within the clocks for a PWM conversion appears as output noise as it is. An arithmetic error such as discarding lower bits in the digital process at a PWM conversion contributes to output noise. In a class D amplifier in prior art, as described in Japanese Patent Publication Sho 59-183510, an output of a class D amplifier is filtered through a low pass filter so that it may be converted to an analog signal to be supplied to a load (a speaker). At the same time, the analog signal is converted to a digital signal to be fedback to an input side. However, this type of processing has a drawback that it requires a high precision A/D (analog to digital) converter, which increases the cumber of components and makes a circuit complex and expensive.

An amplifier has been in actual use that converts PCM sound data ("sound" here means general sound including such as musical tone, without being limited to the so-human sound) to an analog signal, which in turn is converted to a PWM signal. This amplifier, which performs analog processing, can easily feedback an output. But, there is a problem in that when PWM is performed by an analog processing, it is susceptible to an extraneous signal and a signal such as input digital data.

Japanese Patent Publication 2000-196374 (Patent Number 3445177) discloses a class D amplifier that uses $\Delta\Sigma$ modulation. However, since this class D amplifier makes use of $\Delta\Sigma$ modulation, there is a defect that higher frequencies are required, with low power efficiency. Moreover, there is another drawback that proper feedback cannot be performed, because a feedback signal taken at an output of a constant voltage switch is asynchronous with an input clock.

A class D amplifier will be explained that uses only digital processing in prior art.

FIG. 17 is a block diagram for illustrating a structure of a D class amplifier in prior art. In the figure, reference numeral 1 denotes an adder for receiving and adding PCM sound data PD; reference numeral 2 designates a PWM circuit for converting sound data from the adder 1 to a PWM signal; and reference numeral 3 is a feedback circuit H(z) for eliminating quantization noise.

Here, quantization noise is one that is produced because of a limitation in resolution of the PWM circuit 2. For example, in a case where PCM sound data is comprised of 16 bits and the resolution of the PWM circuit 2 is 10 bits, the lower 6 bits of the 16 bits from the adder 1 is input to the feedback circuit H(z) 3 as quantization noise. The feedback circuit H(z) 3, which is comprised of an integration circuit (FIR filter), is a circuit so that a transfer function of an PWM output is 1/(1-H(z)). Output data from the feedback circuit 3 is added to the PCM sound data at the adder 1, which can suppress quantization noise in lower frequencies to increase resolution.

Reference numeral 4 is a multiplier that receives a sampling signal SL synchronized with the PCM sound data. The multiplier 4 consists of a PLL (Phase Locked Loop) to output a pulse signal with a frequency multiplied by the frequency of the sampling signal SL. Reference numeral 5 is an oscillator to produce a sawtooth (or a triangle wave) carrier signal (digital signal) Pct, based on a pulse signal from the multiplier 4, that sequentially increases from 0 to a constant value at which it is reset. The carrier signal Pct is applied to the PWM circuit 2, which generates a PWM signal that rises at a reset time of the carrier signal Pct and falls at a time when the carrier signal Pct agrees with output data from the adder. The PWM signal is furnished to an output switching circuit 6, which in turn amplifies an output from the PWM circuit 2 to be applied to a load (speaker) through a low pass filter.

In the class D amplifier described above, since the multiplier 4 comprised of a PLL is used, jitter is tend to be produced to become output noise. There are many cases where the sampling signal provided from outside includes noise that also generates jitter.

Japanese Utility Model Publication Hei 3-36099 is known as a literature of prior art concerning a class D amplifier.

Accordingly, there is a need to reduce noise in a class D amplifier.

SUMMARY OF THE INVENTION

The invention is directed to a class D amplifier that satisfies the need.

The invention provides a class D amplifier that can reduce noise using only digital signal processing without analog signal processing. The invention also provides a class D amplifier that can be constructed at low cost and that can obtain high quality output.

One aspect of the invention relates to a D class amplifier for receiving a sampling signal and digital data synchronized with the sampling signal and for outputting a pulse width modulation signal corresponding to the digital data. The D class amplifier comprises a master clock generator for generating a master clock with a constant period; a carrier oscillator for producing a carrier signal based on the master clock; a phase comparator for detecting a phase difference between the sampling signal and the carrier signal to produce an output thereof; a loop filter for receiving the phase comparator output to produce an output thereof, the carrier oscillator producing the carrier signal having a frequency corresponding to the loop filter output based on the master clock; a pulse width modulation circuit for converting the digital data to the pulse width modulation signal based on the carrier signal; and a feedback circuit for feedbacking the phase comparator output to the input of the pulse width modulation circuit.

Advantageously, the phase comparator comprises an edge detection circuit for detecting an edge of the sampling signal, and a latch for latching the carrier signal in response to a signal from the edge detection circuit.

Another aspect of the invention is directed to a D class amplifier for receiving a sampling signal and digital data synchronized with the sampling signal and for outputting a pulse width modulation signal corresponding to the digital data. The D class amplifier comprises a master clock generator for generating a master clock with a constant period; a carrier oscillator for producing a carrier signal based on the master clock; a first phase comparator for detecting a phase difference between the sampling signal and the carrier signal to produce an output thereof; an interpolation circuit for obtaining an interpolation function based on the digital data to substitute the first phase comparator output for the obtained interpolation function and produce interpolated data; and a pulse width modulation circuit for converting the interpolated data to the pulse width modulation signal based on the carrier signal.

Advantageously, a D class amplifier further comprises a second phase comparator for detecting a phase difference between the master clock and the sampling signal to produce an output thereof; and a feedback circuit for feedbacking the second phase comparator output to the input of the pulse width modulation circuit.

Preferably, the feedback circuit comprises an adder for adding the second phase comparator output and a quantization noise from the pulse width modulation circuit to produce an output thereof; and a digital filter for feedbacking the adder output to the input of the pulse width modulation circuit.

Preferably, the feedback circuit comprises an adder for adding the second phase-comparator output and a quantization noise from the pulse wi produce an output thereof; and a digital filter for feedbacking the adder output to the input of the pulse width modulation circuit.

DETAILED DESCRIPTION OF THE INVENTION

Referring the figures, the embodiments of the invention will be described hereinbelow.

Figure 1:
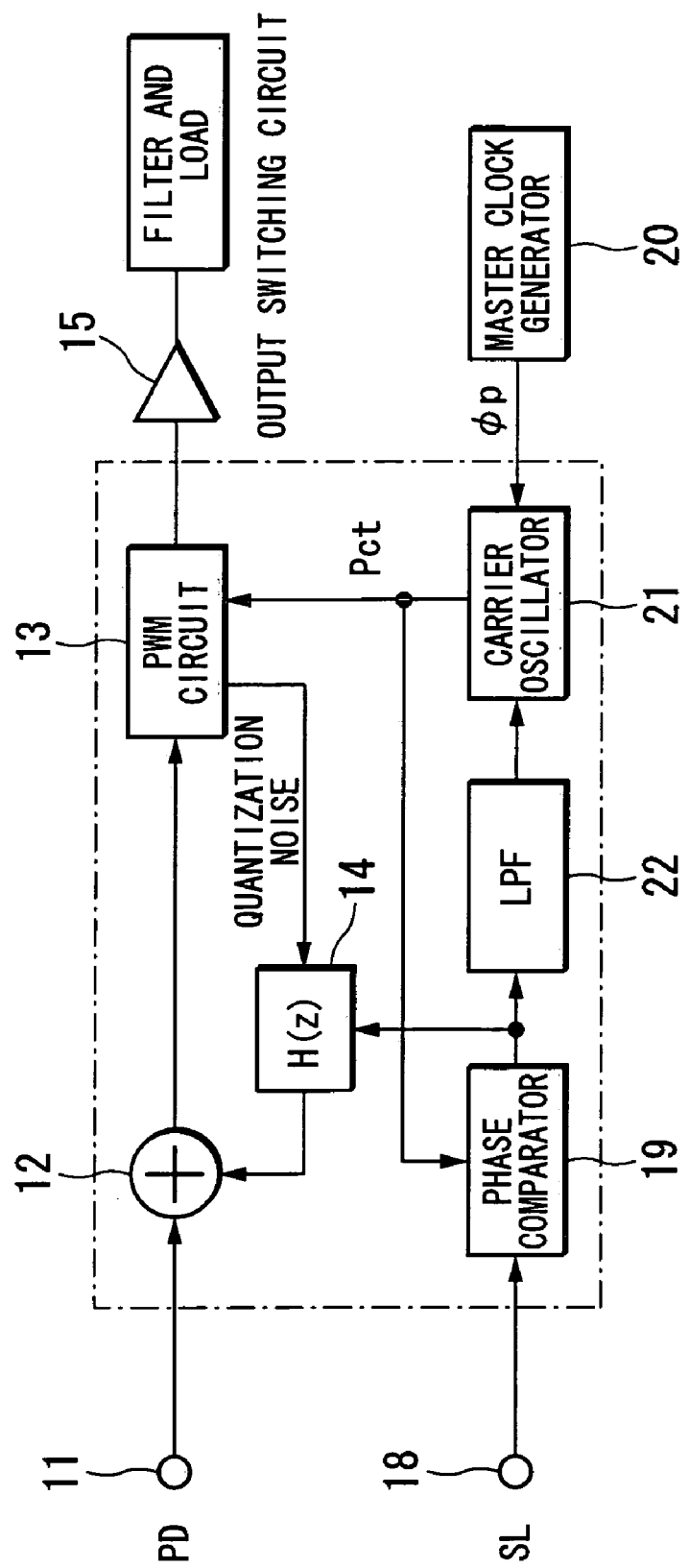
FIG. 1 is a block diagram for illustrating a structure of a first embodiment of a D class amplifier in accordance with the invention.

FIG. 1 is a block diagram for illustrating a structure of a first embodiment of a D class amplifier in accordance with the invention. In the figure, reference numeral 11 denotes an input t terminal for receiving PCM sound data PD (here the "sound" means general sound including such as musical tone, without being restricted to the so human voice sound). Reference numeral 12 denotes an adder. Reference numeral 13 defines a PWM circuit for converting the sound data from the adder 12 to a PWM signal based on a carrier signal Pct. Reference numeral 14 defines a feedback circuit H(z) for suppressing quantization noise form the PWM circuit 13. An output of the feedback circuit H(z) 13 is applied to the adder 12. Reference numeral 15 represents an output switching circuit 15 whose output is applied to a load (a speaker) through a low pass filter. The construction described above is the same as the structural elements 1, 2, 3, and 6.

Reference numeral 18 represents a terminal for receiving a sampling signal SL synchronized with the PCM sound data PD. The sampling signal SL applied at the terminal 18 is furnished to a phase comparator 19. Reference numeral 20 is a master clock generator which produces a master clock Φp based on a crystal oscillator. The master clock Φp is output to a carrier oscillator 21. The carrier oscillator 21, based on the master clock Φp, produces a sawtooth carrier signal Pct (a digital signal) having a frequency corresponding to an output of a loop filter (a low pass filter) 22. The carrier signal Pct, which is a carrier wave to be used for PWM modulation, is supplied to the PWM circuit 13 and the phase comparator 19. The phase comparator 19 detects a phase difference between the sampling signal SL and the carrier signal Pct, which is to be provided to the carrier oscillator 21 through the loop filter and to the feedback circuit 14.

In the structure described above, the phase comparator 19, the loop filter 22, and the carrier oscillator 21 constitute a digital PLL (Phase Locked Loop), by which the carrier signal Pct is controlled to synchronize with the sampling frequency SL.

Figure 2:
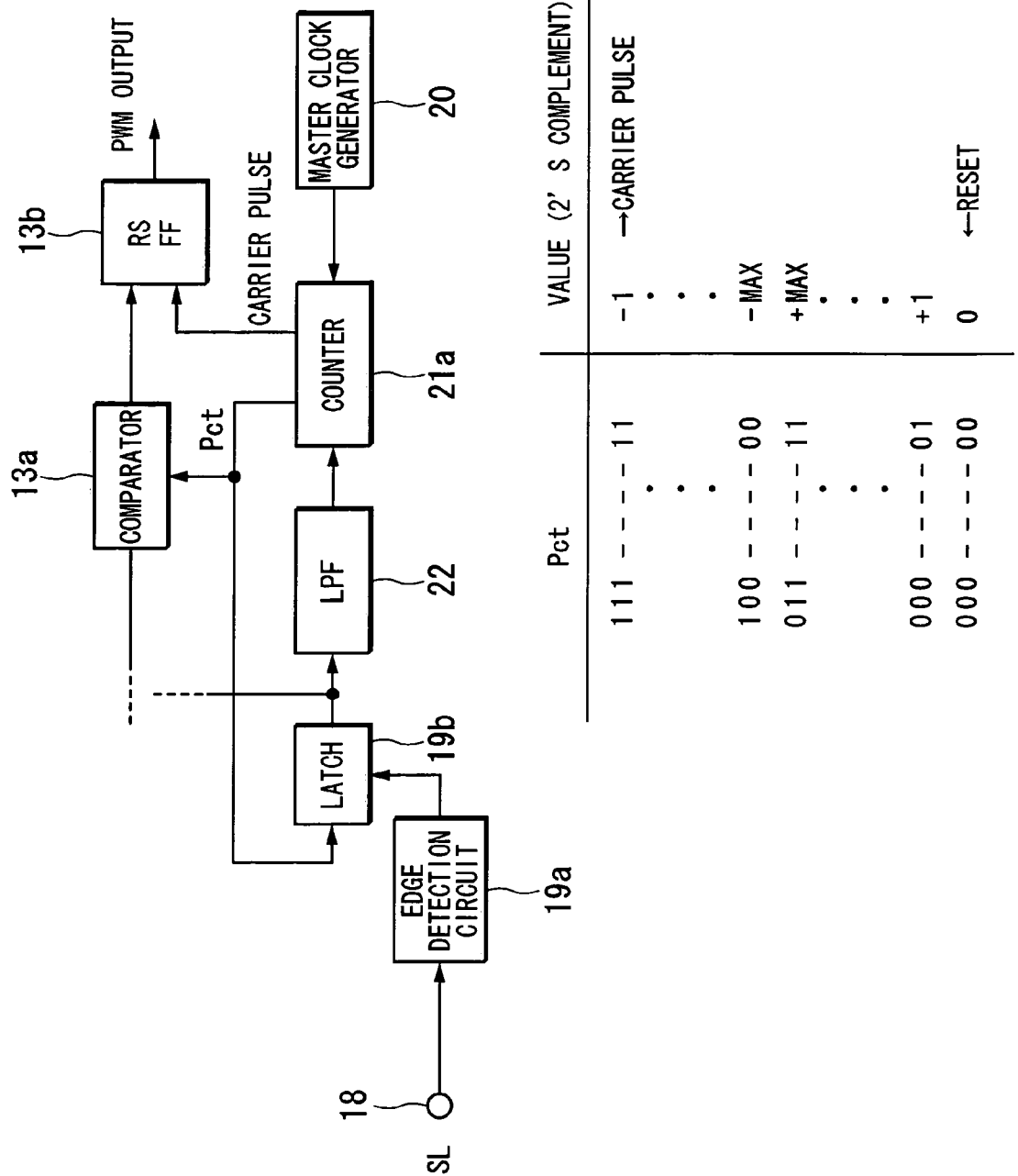
FIG. 2 is a block diagram for illustrating in detail a main portion of the first embodiment shown in FIG. 1.

FIG. 2 is a block diagram for illustrating in detail a main portion of the first embodiment shown in FIG. 1. As shown in the figure, the PWM circuit 13 in FIG. 1 is comprised of a comparator 13a and a set-reset flip flop 13b in FIG. 2; the phase comparator 19 in FIG. 1, an edge detection circuit 19a and a latch 19b in FIG. 2; and the carrier oscillator 21 in FIG. 1, a counter 21a in FIG. 2.

In the structure, the edge detection circuit 19a detects a falling edge of the sampling signal SL and delivers the detected signal to the latch 19b, which, receiving the detected signal, latches the carrier signal Pct from the counter 21a. Then, the latch 19b furnishes its output to the loop filter 22 and the feedback circuit 14 (FIG. 1). The data read in by the latch 19b shows a phase difference between the sampling signal SL and the carrier signal Pct (see (B) and (D) in FIG. 4).

The counter 21a is reset in response to an output of the loop filter 22, and applies a carrier pulse that is a reset signal therefor to a set terminal of the flip flop 13b. The counter 21a counts up from 000 . . . 00 to 111 . . . 11, and outputs the carrier pulse at 111 . . . 11. Sound data, which usually uses two's complement, treats the counter output Pct as two's complement (see FIG. 2).

The comparator 13a compares the sound data from the adder 12 (FIG. 1) with the carrier signal Pct from the counter 21a. When the two agree, the comparator 13a supplies a pulse signal to the flip fop 13b. As described above, the flip fop 13b is set by a carrier pulse from the counter 21a to supply a "H (high)" level signal, and is reset by a pulse from the comparator 13a to supply a "L (low)" level signal. That is, an output of the flip fop 13b represents a signal having a width that corresponds to the sound data from the adder 12 (FIG. 1). The output of the flip fop 13b is applied to the output switching circuit 15 and a load via the low pass filter, as shown in FIG. 1.

The data from the latch 19b is applied to the feedback circuit 14 to be added to the quantization noise of the PWM circuit 13 in the feedback circuit 14. Then, the data is supplied to the adder 12 through the FIR filter constituting the feedback circuit 14. Because of this, jitter, produced by the phase difference between the sampling signal SL and the master clock Φp, is converted to the amplitude and suppressed.

Figure 3:
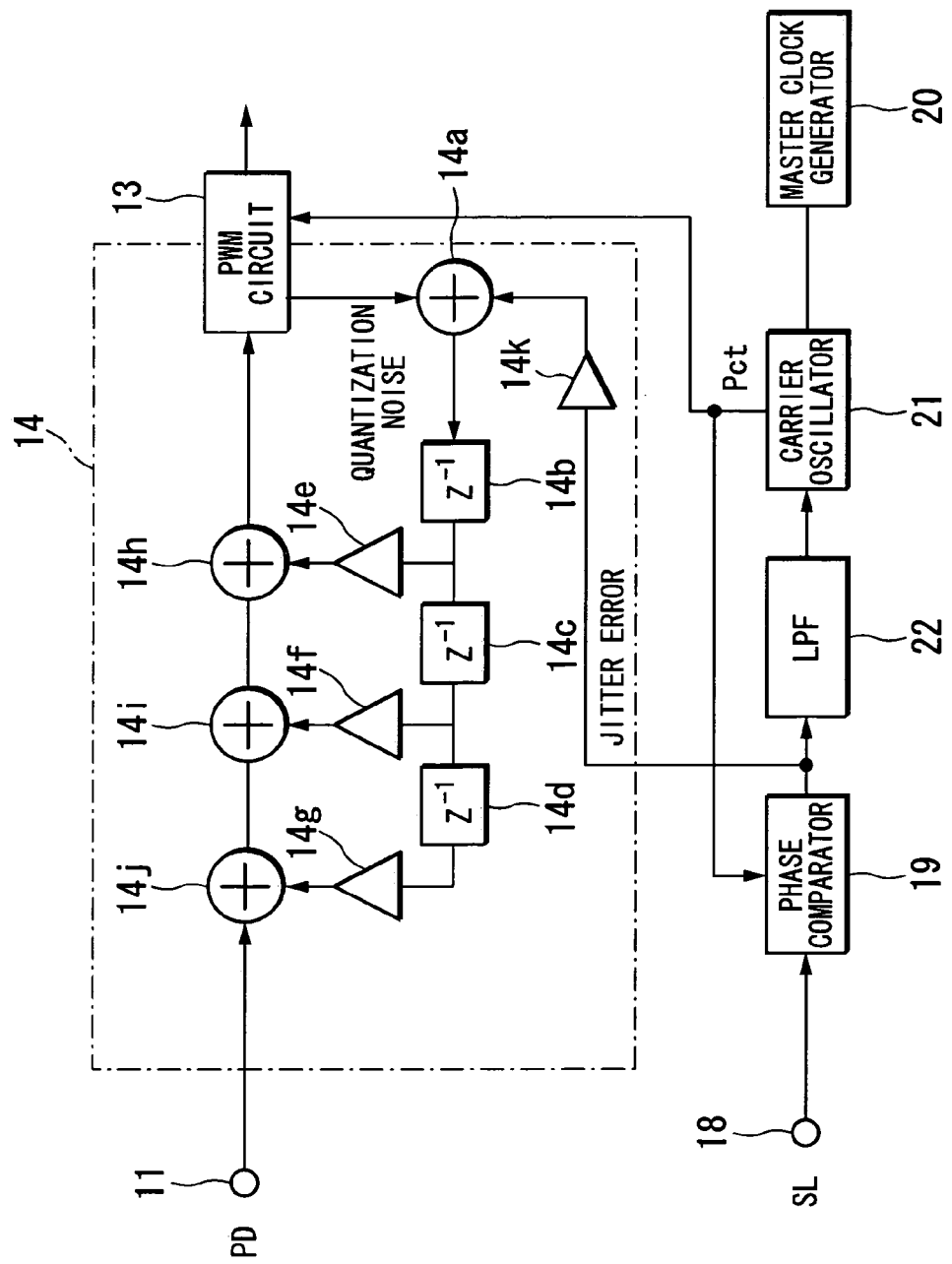
FIG. 3 is a block diagram for illustrating in detail a feedback circuit 14 of the first embodiment.

FIG. 3 is a block diagram for illustrating in detail the feedback circuit 14 of the first embodiment shown in FIG. 1. In the figure, reference numeral 14a denotes an adder that adds the quantization noise from the PWM circuit 13 and the phase difference from the phase comparator 19; reference numerals 14b-14d, a delay circuit, respectively, for causing delay by one period of the clock pulse and providing an output thereof; reference numerals 14e-14g, a multiplier, respectively; reference numeral 14k, a multiplier for adjusting a level of the phase difference; and reference numerals 14h-14j, an adder, respectively. These components constitute an FIR filter.

Figure 4:
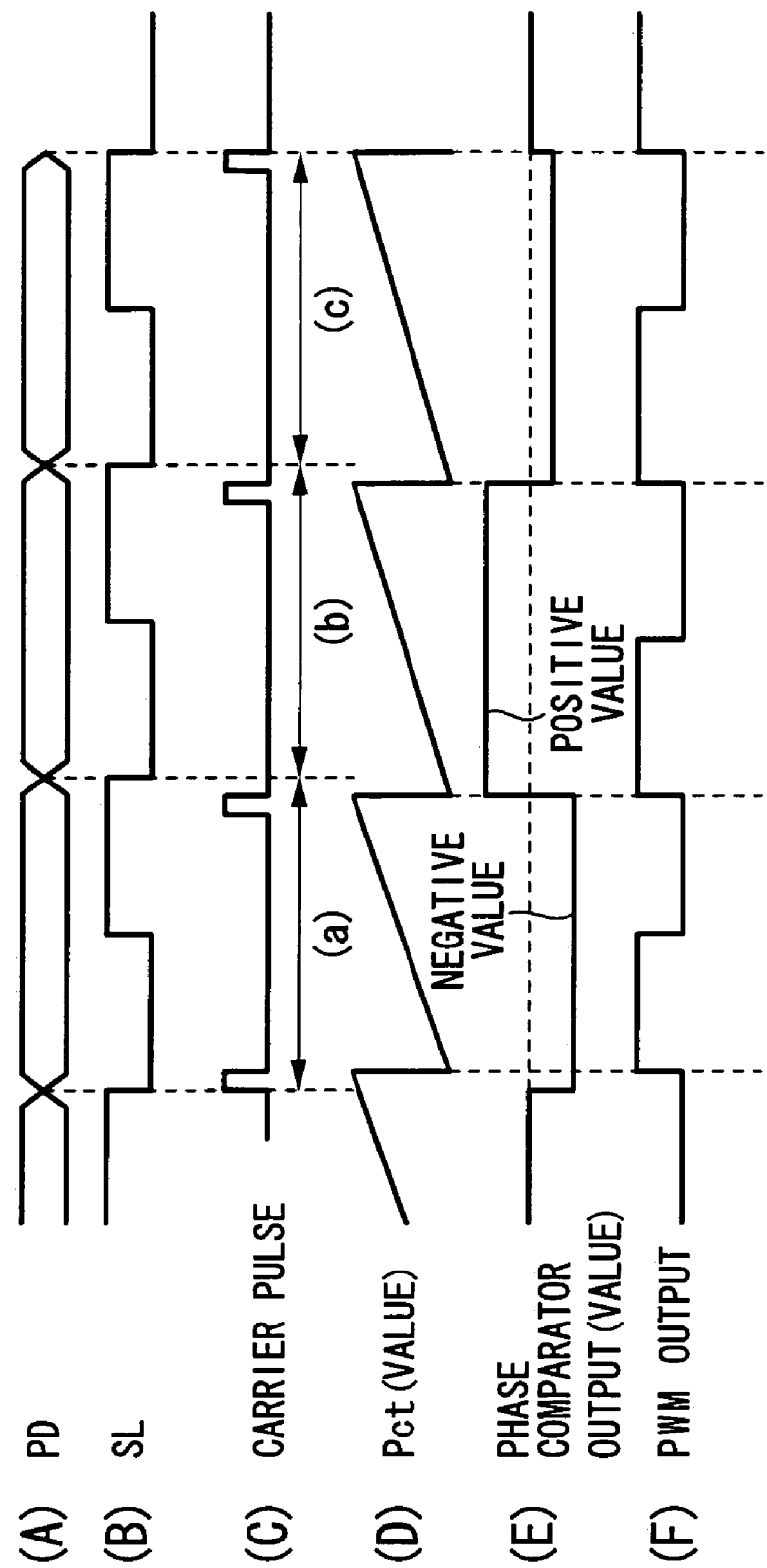
FIG. 4 shows a waveform at each portion of FIG. 1 in the first embodiment.

FIG. 4 shows a waveform at each portion of FIG. 1 in the first embodiment. In the figure, (A) represents PCM sound data PD; (B), a sampling signal SL; (C), a carrier pulse synchronized with the carrier signal Pct; (D), the carrier signal Pct; (E), an output of the phase comparator 19 (an output of the latch 19b); and (F), a PWM output.

As is shown in the figure, during an interval (a), because the SL falls down and the Pct is negative, the output of the phase comparator 19 is negative, which is negatively fedback to the adder 12. This can reduce noise. When the SL and the Pct are synchronized, the output of the phase comparator 19 is about −1 to 0, which makes a feedback value small. A phase difference is fedback accordingly.

Figure 5:
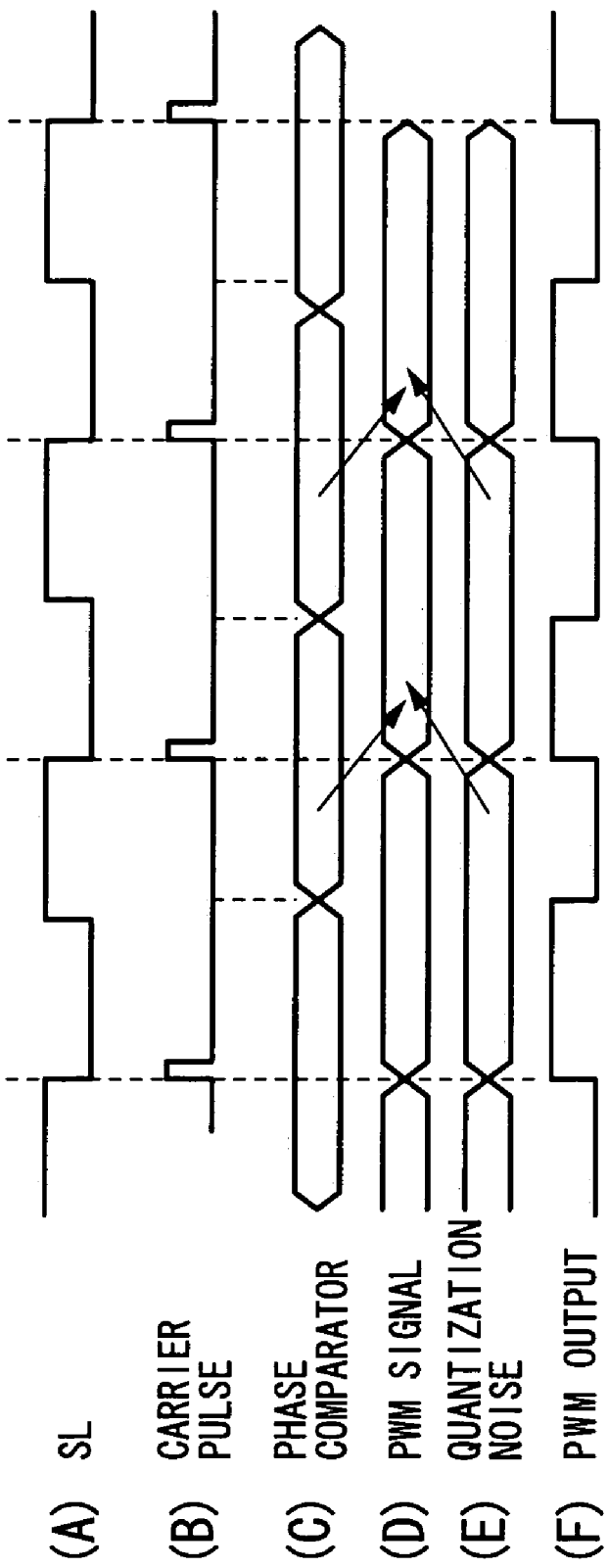
FIG. 5 shows a waveform at each portion of FIG. 1 in the first embodiment.

FIG. 5 also shows a waveform at each portion of FIG. 1 in the first embodiment. In the figure, (A) shows a sampling signal SL; (B), a carrier signal; (C), an output of the phase comparator 19; (D), a PWM signal; (E), quantization noise from the PWM circuit 13; and (F), an output from the PWM circuit 13. As shown in (C)-(E), the circuit of FIG. 1 can treat the quantization noise of the PWM and the phase difference of the digital PLL on an equal basis, and can feedback them to a PWM signal.

As mentioned above, the class D amplifier of FIG. 1 produces a carrier signal Pct based on a master clock Φp without jitter, and synchronizes the carrier signal Pct with a sampling signal SL, using a digital PLL. This can generate the carrier signal Pct that is not affected by jitter (noise) included in the sampling signal SL. Because the carrier signal Pct is negative when the sampling signal SL falls down, the output of the phase comparator 19 is negative. The negative feedback of the output of the phase comparator 19 to the adder 12 reduces noise. This can eliminate jitter caused by a slight difference (which is based on resolution of the master clock Φp) between the sampling signal SL and the master clock Φp.

A PLL may be formed in analog form. When the analog PLL is connected with the feedback circuit 14, an A/D (analog to digital) converter is necessary. Accordingly, a digital PLL is preferable. The digital PLL, as shown in FIG. 1, can easily get a phase difference between the sampling signal SL and the carrier signal Pct in digital data. With respect to feedback of a phase difference, when the feedback circuit 14 is not present or is not shared, another feedback circuit Hp(z) may be provided.

Next, a second embodiment in accordance with the invention will be discussed, referring to FIGS. 6 and 7.

Figure 6:
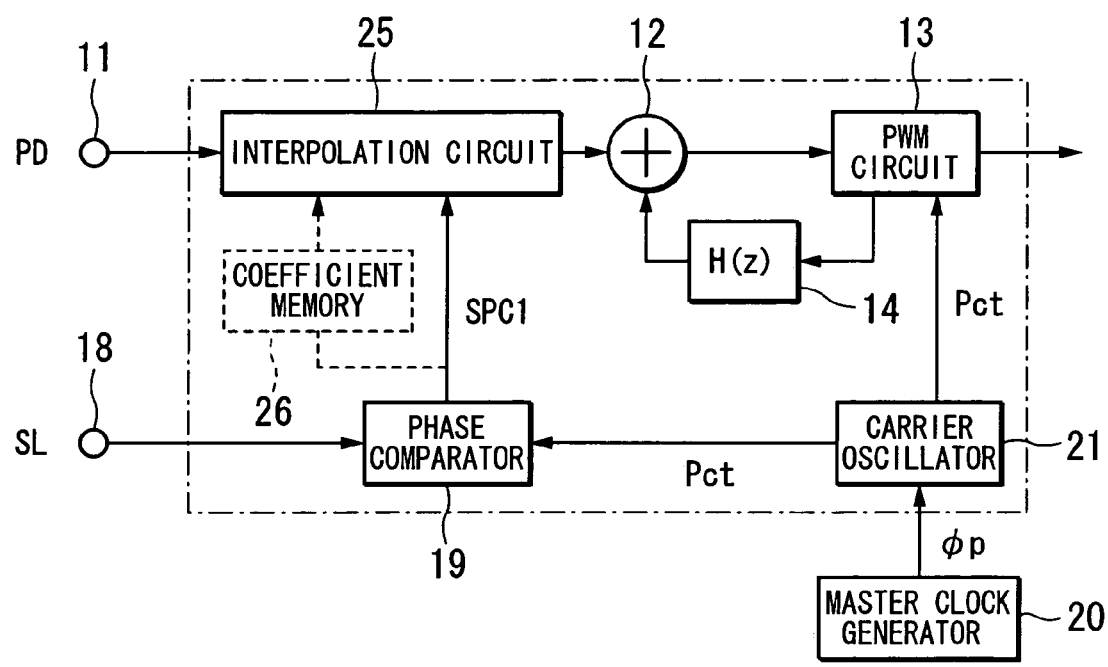
FIG. 6 is a block diagram for illustrating a structure of a second embodiment of a D class amplifier in accordance with the invention.

FIG. 6 is a block diagram for illustrating a structure of a second embodiment of a D class amplifier in accordance with the invention. Constituent elements of the second embodiment that are the same as those of the first embodiment are represented by like reference numerals and will not be repetitiously explained.

The circuit of FIG. 6 is different from that of FIG. 1 in the following points. Firstly, the circuit of FIG. 6 does not use a PLL circuit. An carrier oscillator 21 produces a carrier signal Pct based only on a master clock Φp supplied by a master clock generator 20. Secondly, there is provided an interpolation circuit 25 consisting of an FIR filter, between an input terminal 11 and an adder 12. Thirdly, a phase difference between the sampling signal SL and the carrier signal Pct is detected by a phase comparator 19, and phase difference data SPC1 showing the detected result is supplied to the interpolation circuit 25.

Figure 7:
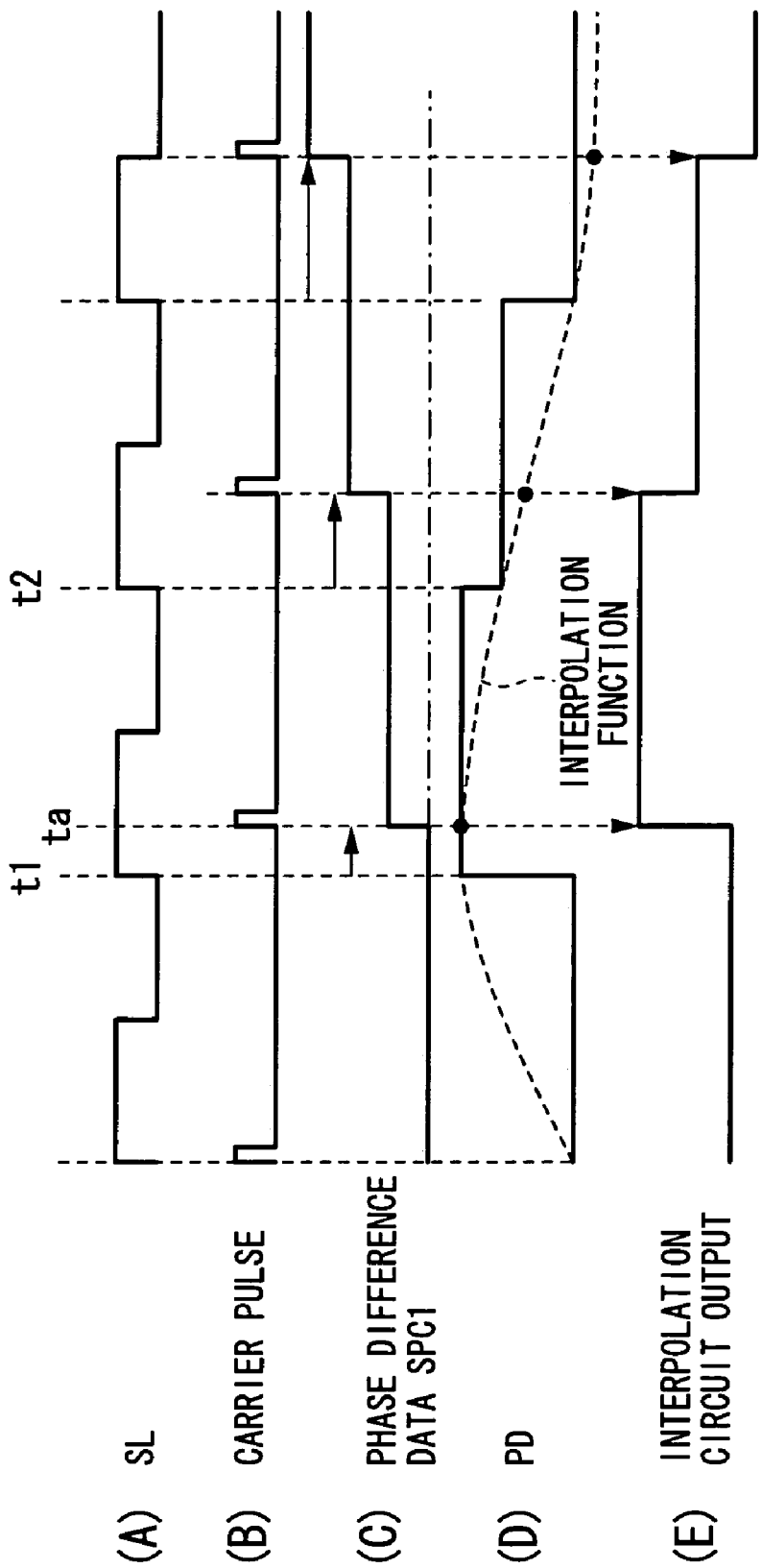
FIG. 7 shows a waveform at each portion of FIG. 6 in the second embodiment.

FIG. 7 shows a waveform at each portion of FIG. 6 in the second embodiment. Referring the figure, the interpolation circuit 25 will be explained in detail. In the embodiment shown in FIG. 6, the sampling signal SL is not synchronized with the carrier signal Pct. As a result, as shown in FIG. 7, the phase of a carrier pulse ((B) in FIG. 7), which has been in phase with the sampling signal SL ((A) in FIG. 7) and the carrier signal Pct, gradually gets out of phase, as shown in (C) in FIG. 7. Accordingly, the interpolation circuit 25 obtains an interpolation function from the PCM sound data ((D) in FIG. 7) and then obtains interpolated data by substituting the phase difference data SPC1 for the obtained interpolation function, which is output ((E) in FIG. 7).

To be specific, an example is taken in a case where interpolated data will be obtained at time ta in FIG. 7, designating an interpolation function as ax+b. The coefficients a and b of the interpolation function between time t1 and t2 is obtained from the PCM sound data at time t1 and t2. Then, interpolated data is obtained by substituting the phase difference data SPC1 for x of the interpolation function obtained in this way.

The above-mentioned interpolation function has less noise as order becomes higher. However, calculation of coefficients becomes extremely large. In the case, as shown in FIG. 6, a coefficient memory 26 should be provided beforehand. When coefficients of an FIR filter are selected by the phase difference data SPC1, order can be raised easily.

A third embodiment in accordance with the invention will be described.

Since the second embodiment described above does not have resolution exceeding the frequency of the master clock Φp, sample and hold is performed as re-sampling concerning the frequency components above the frequency of the master clock Φp, which generates aliasing noise.

Figure 8:
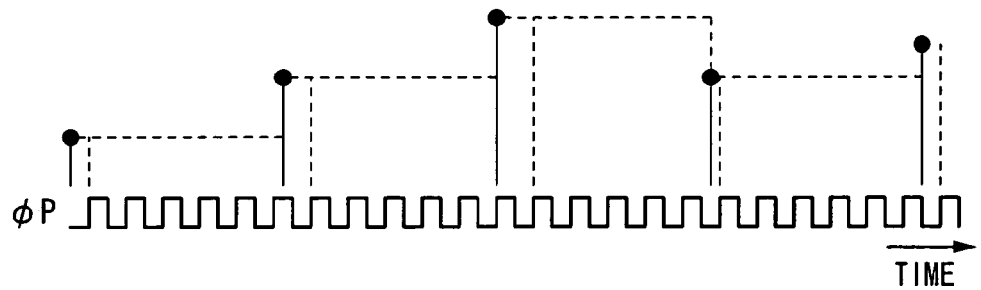
FIG. 8 is a timing chart for illustrating a problem in the second embodiment.

FIG. 8 is a timing chart for illustrating this problem in the second embodiment. In the figure, black circles denote the PCM sound data, and Φp represents the master clock.

As shown in the figure, the sample and hold is performed for the input data shown by black circles is, and is re-sampled at the time when the next master clock (dp rises (broken lines) to be converted to a PWM signal. A difference between the rising of the master clock Φp and the timing of the input data causes jitter.

Figure 9:
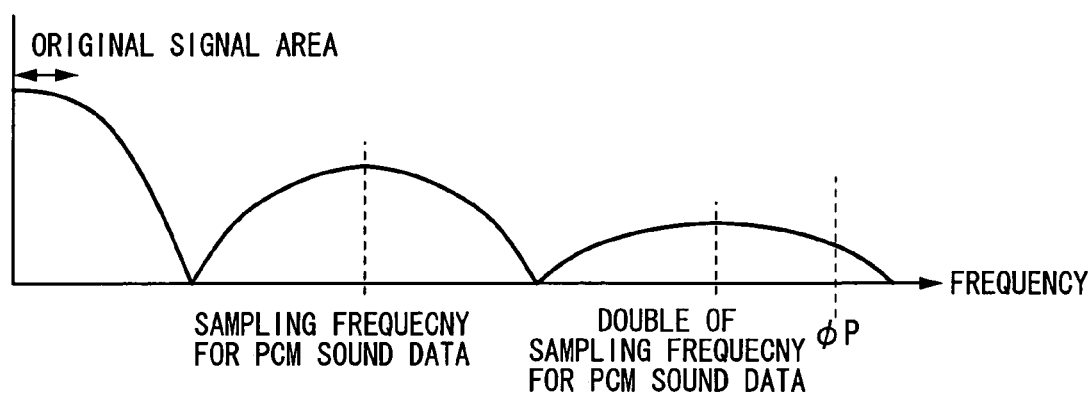
FIG. 9 is a diagram for illustrating a problem in the second embodiment.

FIG. 9 is a diagram for illustrating a problem in the second embodiment. With regard to frequency, as shown in FIG. 9, the sample and hold produces a response waveform shown in solid line. Aliasing distortion occurs at the frequencies lower than the master clock Φp which is different from the sampling frequency of the PCM sound data. As a result, noise is detected in the original frequency region of the PCM sound data.

In FIG. 9, the left most dotted line represents the sampling frequency for the PCM sound data. The center dotted line shows a frequency double the sampling frequency. The right dotted line designates a frequency of the master clock Φp.

Figure 10:
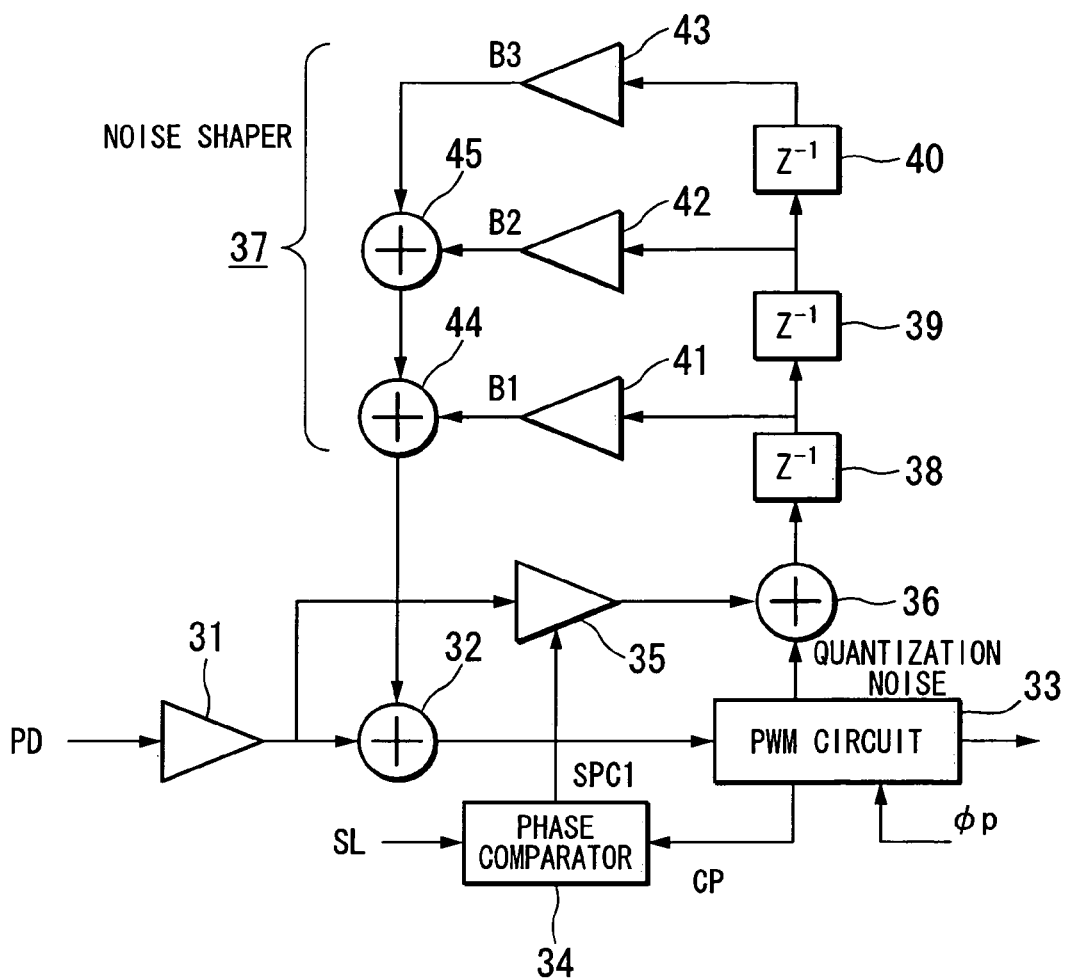
FIG. 10 is a block diagram for illustrating a structure of a D class amplifier that has solved the problem in the second embodiment.
Figure 11:
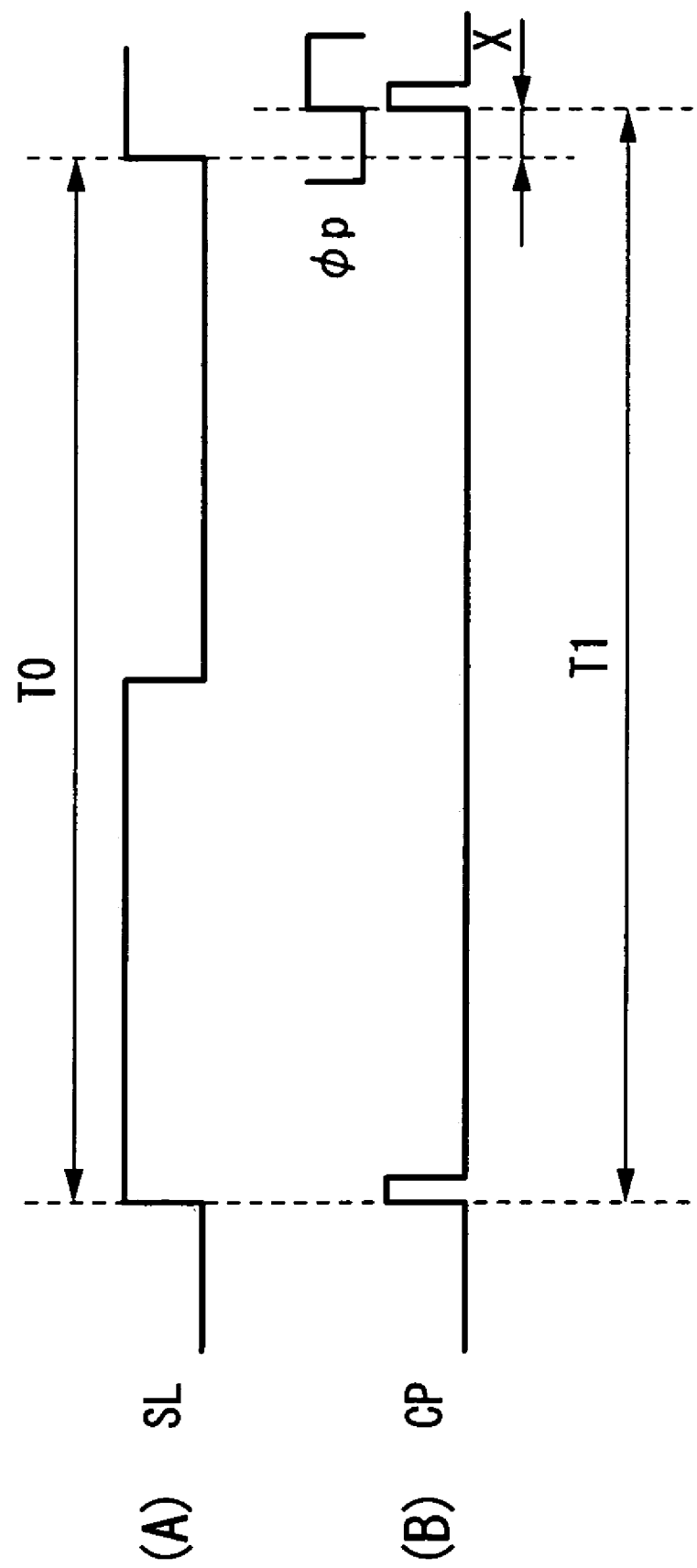
FIG. 11 shows waveforms for illustrating the operation of a circuit shown in FIG. 10.

Therefore, there is an idea that the above mentioned error is converted to the amplitude, and that the noise caused by the jitter can be reduced using a noise shaping circuit. FIG. 10, which represents a circuit based on the idea, is a block diagram for illustrating a structure of a D class amplifier that has solved the problem in the second embodiment. In the figure, reference numeral 31 represents a multiplier for multiplying a PWM sound signal PD by a constant; reference numeral 32, an adder for receiving data from the multiplier 31; and reference numeral 33, a PWM circuit for converting data from the adder 32 to a PWM signal. The PWM circuit 33 has a built-in carrier oscillator that produces a carrier signal based on the master clock Φp. Using the carrier signal, the PWM circuit 33 converts an output of the adder to a PWM signal and applies a carrier pulse CP synchronized with the carrier signal to a phase comparator 34. The phase comparator 34 detects a phase difference between the sampling signal SL ((A) in FIG. 11) and the carrier pulse CP ((B) in FIG. 11) to supply a phase difference data SPC1 to a multiplier 35.

The multiplier 35 multiplies the output data from the multiplier 31 by the phase difference data SPC1, whose multiplication result is provided to an adder 36. The adder adds the output from the multiplier 35 and the quantization noise from the PWM circuit 33, whose added result is supplied to a noise shaper 37. The noise shaper 37 is a FIR filter that includes a delay circuit 38 for delaying an output of the adder 36 by one clock of the clock pulse, a delay circuit 39 for delaying an output of the delay circuit 38 by one clock of the clock pulse, a delay circuit 40 for delaying an output of the delay circuit 39 by one clock of the clock pulse, multipliers 41-43 for multiplying each output from the delay circuits 38, 39 and 40 by a constant, an adder 45 for adding the outputs from the multipliers 42 and 43, and an adder 44 for adding the output from the adder 45 and the output from the multiplier 41. The output of the adder 44 is added to the adder 32 that adds the output from the aforementioned noise shaper 37 and the output from the multiplier 31, whose added result is delivered to the PWM circuit 33.

According to the above structure, noise based on a phase difference between the sampling signal SL and the master clock Φp is fedback with the quantization noise to the input to be suppressed. As a result, there is no aliasing caused by re-sampling that is used for converting from the sampling signal SL to the master clock Φp, which produces the advantage that few harmonic components can be found at higher frequencies and higher amplitudes.

However, when the value of the phase difference data SPC1 is large, noise is large and cannot be suppressed by the noise shaper 37. Accordingly, a third embodiment of the invention that has solved this disadvantage will be described below.

Figure 12:
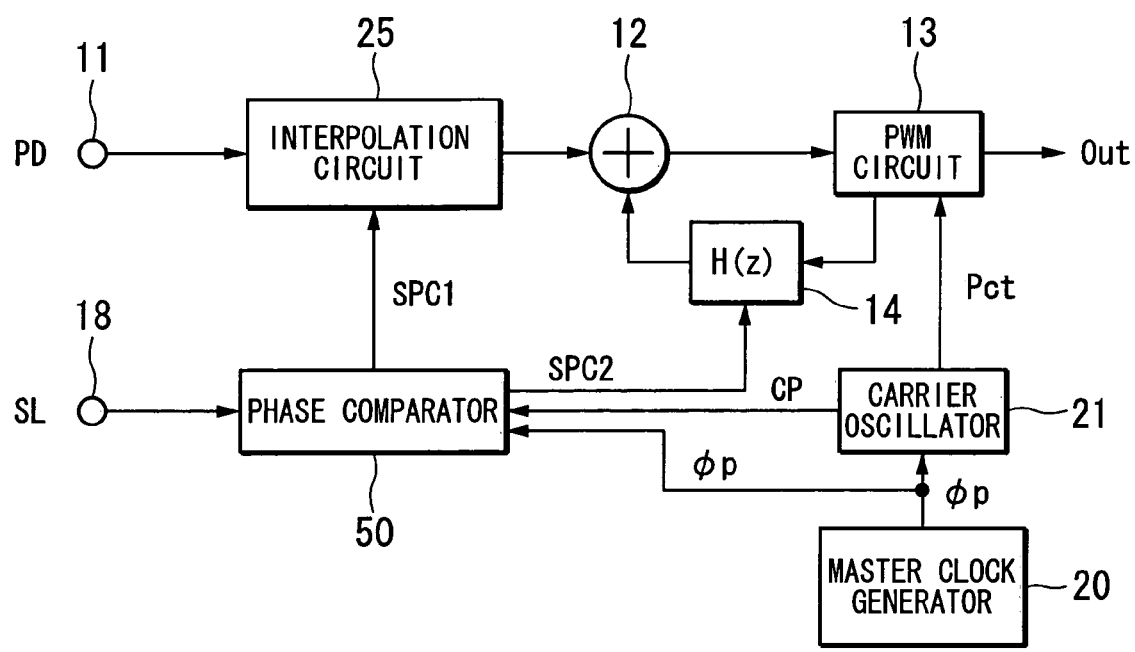
FIG. 12 is a block diagram for illustrating a structure of a third embodiment of a D class amplifier in accordance with the invention.

FIG. 12 is a block diagram for illustrating a structure of a third embodiment of a D class amplifier in accordance with the invention. In the figure, constituent elements that are the same as those of the second embodiment in FIG. 6 are represented by like referenced numerals, and will not be repetitiously explained. The difference between the constituent elements in FIG. 12 and those in FIG. 6 is that the phase comparator 19 in FIG. 6 is replaced by a phase comparator 50.

Furthermore, a carrier oscillator 21 in FIG. 12 produces a carrier pulse CP in addition to the carrier signal Pct.

The phase comparator 50 detects a phase difference between the sampling signal SL and the carrier pulse CP from the carrier oscillator 21, and furnishes the phase difference data SPC1 to the interpolation circuit 25. At the same time, the phase comparator 50 detects a phase difference between the sampling signal SL and the master clock Φp to provide the phase difference data SPC2 to the feedback circuit 14.

The interpolation circuit 25, as explained with respect to FIG. 6, obtains an interpolation function based on PCM sound data to substitute the phase difference data SPC1 for the obtained interpolation function, which produces interpolated sound data to be supplied to the adder 12. By doing so, noise based on the phase difference data SPC1 is modified. The feedback circuit 14, as is explained regarding FIG. 1, adds the phase difference data SPC2 and the quantization noise from the PWM circuit 13, whose added result is furnished to the adder 12 through the FIR filter. This suppresses noise based on the phase difference data SPC2.

Figure 13:
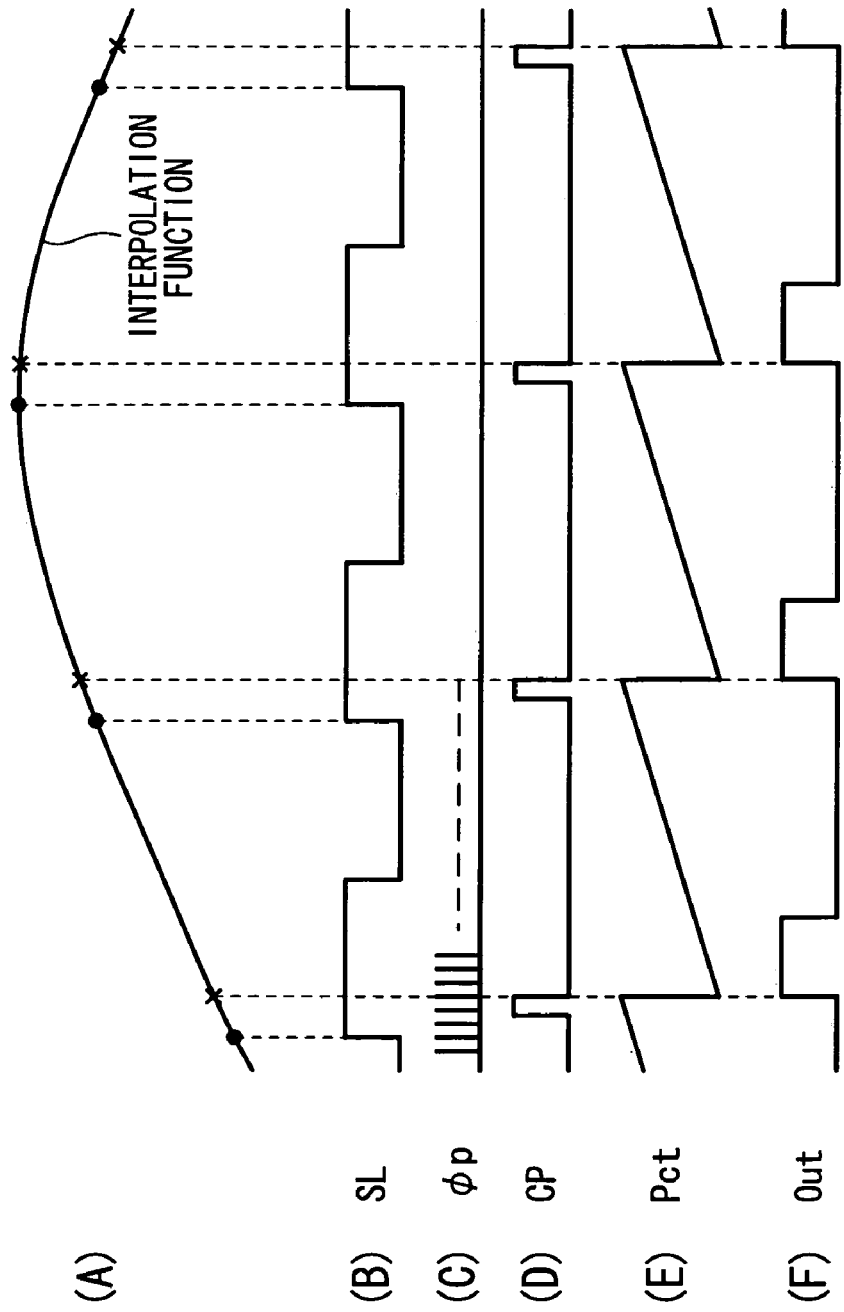
FIG. 13 shows a waveform at each portion of FIG. 12 in the third embodiment.

FIG. 13 shows a waveform at each portion of FIG. 12 in the third embodiment. (A) of FIG. 13 represents a interpolation function where dark circles show PCM sound data and symbol x designates interpolated sound data, respectively. (B) of FIG. 13 denotes the sampling signal SL. (C)-(F) of FIG. 13 show the master clock Φp, carrier pulse CP, carrier signal Pct, and an output of the PWM circuit 13, respectively.

Figure 14:
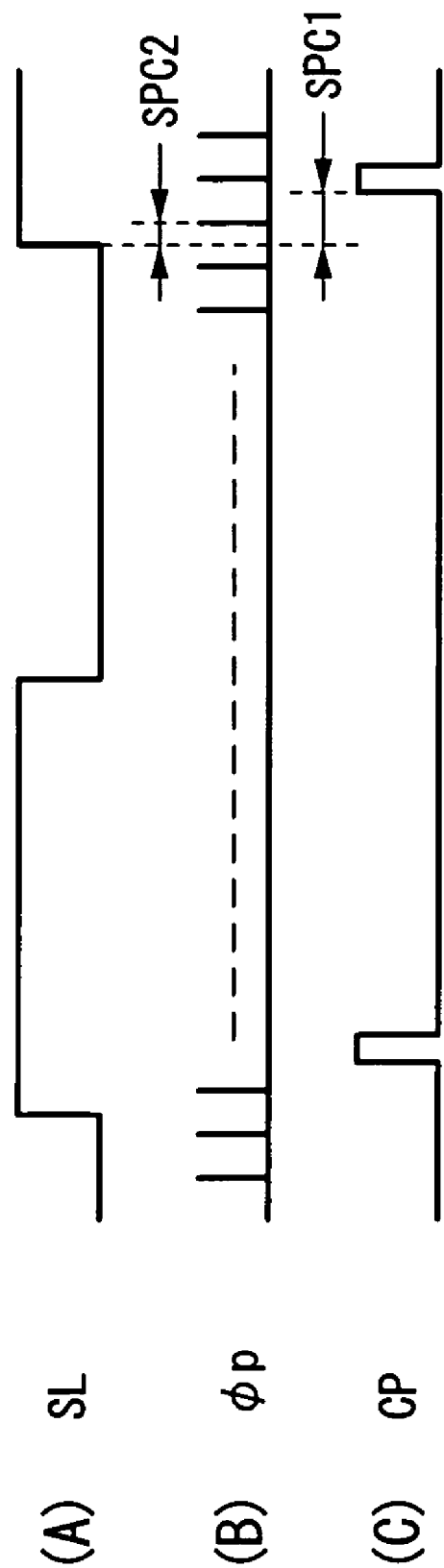
FIG. 14 shows an enlarged waveform for each of (B), (C) and (D) of FIG. 13.

FIG. 14 shows an enlarged waveform for each of (B), (C) and (D) of FIG. 13. (A) of FIG. 14 represents the sampling signal SL, and (B) of FIG. 14 shows the master clock Φp. The data showing a phase difference between the master clock Φp and the sampling signal SL is the phase difference data SPC2 shown in the figure. (C) of FIG. 14 denotes the carrier pulse CP. The data showing a phase difference between the carrier pulse CP and the sampling signal SL is the phase difference data SPC1 shown in the figure.

The above describes in detail the embodiments in accordance with the invention. The embodiments, which use PWM, have the advantage that they contain low frequencies and high power efficiency. The comparison of the sampling signal SL with the output waveform is performed by a PWM clock, which can be synchronized.

The idea of the aforementioned embodiments is effective to reduction of noise caused by jitter even when it is applied to a DAC (digital to analog converter) and a ΔΣ DAC.

Figure 15:
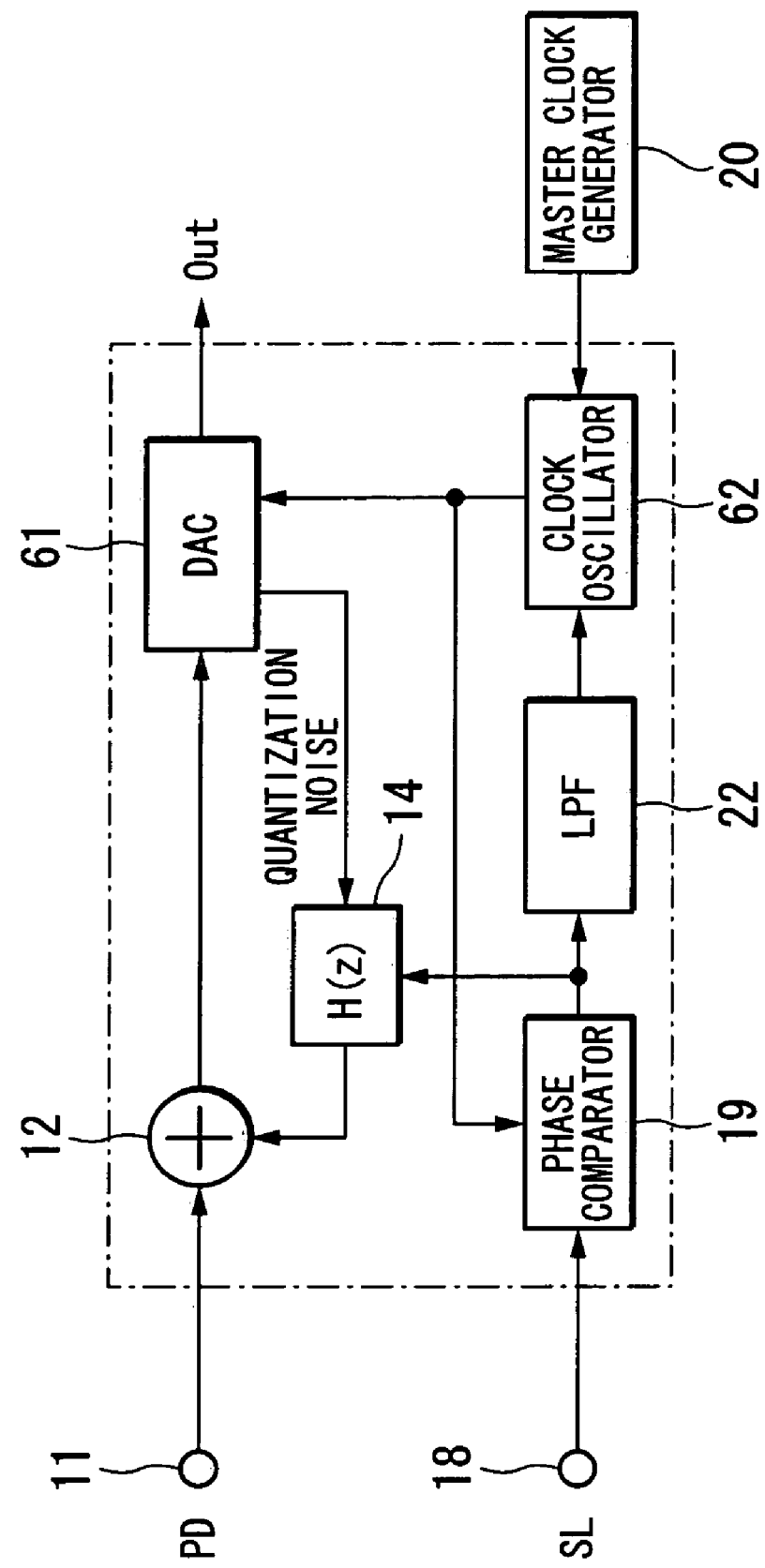
FIG. 15 is a block diagram for illustrating a structure of a DAC that utilizes a circuit shown in FIG. 1.

FIG. 15 is a block diagram for illustrating a structure of a DAC that utilizes a circuit shown in FIG. 1, and has the following construction. In FIG. 15, the PWM circuit 13 and the subsequent elements in FIG. 1 are replaced by a DAC 61. PCM sound data PD applied at the input terminal 11 is added to the DAC 61 through the adder 12, in which it is converted to an analog signal to be output. Quantization noise in the DAC 61 is fedback to the adder 12 through the feedback circuit 14 to be suppressed.

A clock oscillator 62 generates a clock based on the master clock Φp 20, which is delivered to the DAC 61. The clock is synchronized with the sampling signal SL by the digital PLL consisting of the phase comparator 19, the loop filter 22 and the clock oscillator 62. Even when the sampling signal SL includes noise, this can supply the clock without jitter to the DAC 61, which outputs an analog signal having little noise.

Figure 16:
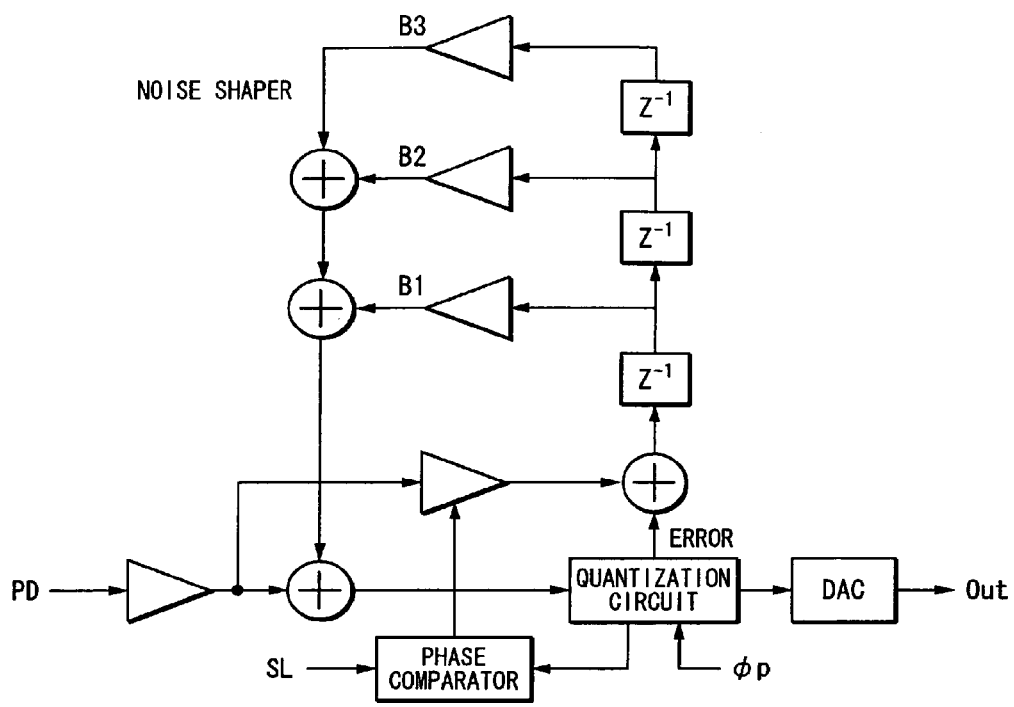
FIG. 16 is a block diagram for illustrating a structure of a DAC that utilizes a circuit shown in FIG. 10.
Figure 17:
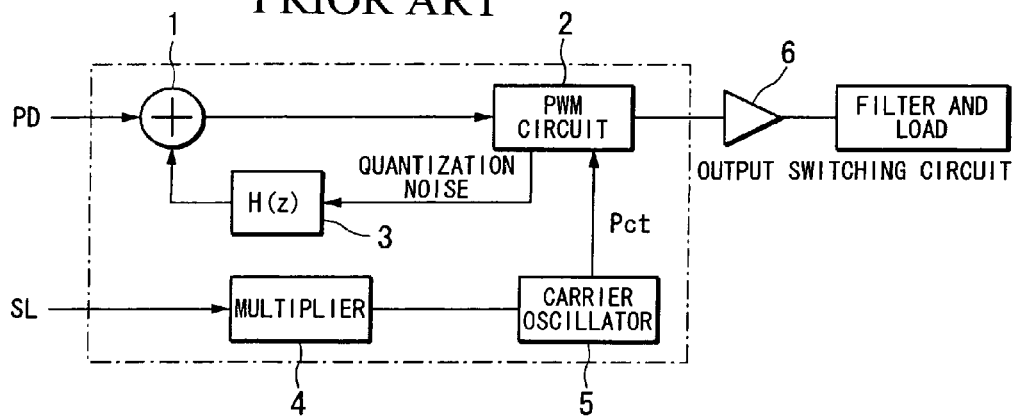
FIG. 17 is a block diagram for illustrating a structure of a D class amplifier in prior art.

FIG. 16 is a block diagram for illustrating a structure of a DAC that utilizes a circuit shown in FIG. 10. This is another example.

It is evident that the invention can be applied to not only sound data but also other kinds of data such as musical data.

The invention can be applied to an AV amplifier.

According to the invention, noise can be reduced using only digital signal processing without analog signal processing, by which a class D amplifier can be constructed at low cost with high quality output.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A D class amplifier for receiving a sampling signal and digital data synchronized with the sampling signal and for outputting a pulse width modulation signal corresponding to the digital data, the D class amplifier comprising:
   a master clock generator for generating a master clock with a constant period;
   a carrier oscillator for producing a carrier signal based on the master clock;
   a phase comparator for detecting a phase difference between the sampling signal and the carrier signal to produce an output thereof;
   a loop filter for receiving the phase comparator output to produce an output thereof, the carrier oscillator producing the carrier signal having a frequency corresponding to the output of the loop filter based on the master clock;
   a pulse width modulation circuit for converting the digital data to the pulse width modulation signal based on the carrier signal; and
   a feedback circuit for feeding the output of the phase comparator to the input of the pulse width modulation circuit.

2. A D class amplifier as recited in claim 1, wherein the phase comparator comprises an edge detection circuit for detecting an edge of the sampling signal, and a latch for latching the carrier signal in response to a signal from the edge detection circuit.

3. A D class amplifier for receiving a sampling signal and digital data synchronized with the sampling signal and for outputting a pulse width modulation signal corresponding to the digital data, the D class amplifier comprising:
   a master clock generator for generating a master clock with a constant period;
   a carrier oscillator for producing a carrier signal based on the master clock;
   a first phase comparator for detecting a phase difference between the sampling signal and the carrier signal to produce an output thereof;
   an interpolation circuit for obtaining an interpolation function based on the digital data to substitute the output of the first phase comparator for a variable of the obtained interpolation function and produce interpolated data; and
   a pulse width modulation circuit for converting the interpolated data to the pulse width modulation signal based on the carrier signal.

4. A D class amplifier as recited in claim 3, further comprising:
   a second phase comparator for detecting a phase difference between the master clock and the sampling signal to produce an output thereof; and
   a feedback circuit for feedbacking the output of the second phase comparator to the input of the pulse width modulation circuit.

5. A D class amplifier as recited in claim 1, wherein the feedback circuit comprises:
   an adder for adding the output of the second phase comparator and a quantization noise from the pulse width modulation circuit to produce an output thereof; and
   a digital filter for feedbacking the output of the adder to the input of the pulse width modulation circuit.

6. A D class amplifier as recited in claim 4, wherein the feedback circuit comprises:
   an adder for adding the output of the second phase comparator and a quantization noise from the pulse width modulation circuit to produce an output thereof; and
   a digital filter for feedbacking the output of the adder to the input, of the pulse width modulation circuit.

* * * * *